(12) United States Patent
Jang et al.

(10) Patent No.: US 8,000,154 B2
(45) Date of Patent: Aug. 16, 2011

(54) NON-VOLATILE MEMORY DEVICE AND METHOD OF CONTROLLING A BULK VOLTAGE THEREOF

(75) Inventors: Chae Kyu Jang, Icheon-si (KR); Jong Hyun Wang, Cheongju-si (KR); Suk Yun, Icheon-si (KR); Seong Hun Park, Gunsan-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 264 days.

(21) Appl. No.: 12/130,931

(22) Filed: May 30, 2008

(65) Prior Publication Data

US 2009/0122616 A1    May 14, 2009

(30) Foreign Application Priority Data

Nov. 13, 2007 (KR) .................. 10-2007-0115601

(51) Int. Cl.
*G11C 5/14* (2006.01)
(52) U.S. Cl. ......... 365/189.09; 365/185.11; 365/185.18; 365/185.22

(58) Field of Classification Search ............. 365/185.22, 365/185.18, 185.11, 185.09
See application file for complete search history.

(56) References Cited

U.S. PATENT DOCUMENTS

| 7,085,160 | B2 * | 8/2006 | Shiga et al. ............ 365/185.17 |
| 7,382,652 | B2 * | 6/2008 | Shiga et al. ............ 365/185.17 |
| 2008/0183951 | A1 * | 7/2008 | Lee et al. .................... 711/103 |
| 2009/0027957 | A1 * | 1/2009 | Jang ......................... 365/185.2 |
| 2009/0031080 | A1 * | 1/2009 | Kim et al. .................... 711/114 |

FOREIGN PATENT DOCUMENTS

KR  1020050011220 A  1/2005

* cited by examiner

*Primary Examiner* — Pho M Luu
(74) *Attorney, Agent, or Firm* — Kilpatrick Townsend & Stockton LLP

(57) ABSTRACT

A non-volatile memory device comprises a voltage supplier comprising memory cells in which the voltage supplier supplies a positive set voltage to a bulk of a memory cell array at the time of a read operation of the memory cells and a controller for controlling the voltage supplier to set and supply a bulk voltage depending on a number of erase/program cycles of the memory cell array.

17 Claims, 6 Drawing Sheets

NON-VOLATILE MEMORY DEVICE AND METHOD OF CONTROLLING A BULK VOLTAGE THEREOF

CROSS-REFERENCES TO RELATED APPLICATIONS

The present application claims priority to Korean patent application number 10-2007-115601, filed on Nov. 13, 2007, which is incorporated by reference in its entirety.

BACKGROUND OF THE INVENTION

The present invention relates to the supply of voltage to a non-volatile memory device and, more particularly, to a non-volatile memory device and a method of controlling a bulk voltage thereof, in which voltage applied to a bulk is controlled at the time of a program verification or read operation.

There is an increasing demand for non-volatile memory devices that can be electrically programmed and erased and that retain their data when power is off. In order to develop large-capacity memory devices capable of storing a large amount of data, highly-integrated memory cells have been developed. To this end, a NAND type flash memory device includes a plurality of memory cells connected in series to form one string. A plurality of the strings forms one memory cell array.

Flash memory cells of a NAND flash memory device include a current path formed between a source/drain region on a semiconductor substrate, and a floating gate and a control gate formed between insulating layers over the semiconductor substrate. A program operation of a flash memory cell is generally performed by grounding the source/drain region of a memory cell and a semiconductor substrate (that is, a bulk region) and applying a positive high voltage to the control gate to generate Fowler-Nordheim (F-N) tunneling between the floating gate and the substrate. In F-N tunneling, electrons of the bulk region are accumulated on the floating gate by an electric field of the high voltage applied to the control gate and, therefore, the threshold voltage of the memory cell is increased.

In recent years, in order to further increase the level of integration of the flash memory, active research has been made on a multi-bit cell that stores plural data in one memory cell. This type of a memory cell is generally called a multi-level cell (MLC). A memory cell of a single bit is called a single level cell (SLC).

FIG. 1A illustrates program threshold voltage distributions of a MLC.

Referring to FIG. 1A, the threshold voltage of a MLC that stores 2-bit data information shifts to one of four kinds of threshold voltage distributions in response to a program operation. It is assumed that the state 110 of a general cell illustrates a data state '11'. The state 110 is divided into threshold voltage distributions 120 indicating a data state '10', threshold voltage distributions 130 indicating a data state '00', and threshold voltage distributions 140 indicating a data state '01' according to a program state.

Memory cells, programmed to have the threshold voltage distributions as shown in FIG. 1A, are erased on a per block basis. This block-based erase is represented as a shift of the following threshold voltage distributions.

FIG. 1B illustrates the shift of threshold voltage distributions due to an erase of a MLC.

Referring to FIG. 1B, in order to erase the memory cells programmed to have the threshold voltage distributions as shown in FIG. 1A, the threshold voltage distributions 120, 130 are first programmed so that they are changed to the threshold voltage distributions 140 having the highest level (S110).

After the memory cells shift to the threshold voltage distributions 140, an erase is performed on a per block basis (S120). If the erase is performed, the memory cells shift to the threshold voltage distributions 110.

Cells that have shifted to the threshold voltage distributions 110 or less of a desired erase cell (because the erase is performed too excessively according to the characteristics of memory cells) are subjected to a soft program and are included in the threshold voltage distributions 110 of FIG. 1B.

Program and erase operations as described above are repeatedly performed on memory cells of a flash memory device. As the number of cycles of erase and program operations is increased, the characteristics of the memory cells become degraded.

BRIEF SUMMARY OF THE INVENTION

The present invention is directed towards a non-volatile memory device and a method of controlling a bulk voltage thereof, in which it can compensate for the characteristics of a memory cell, which are degraded due to an erase/program (E/P) cycle of the non-volatile memory device.

A non-volatile memory device according to an aspect of the present invention includes a voltage supplier and a controller. The voltage supplier supplies a set voltage to a bulk of a memory cell array, including memory cells, at the time of a read operation of the memory cells. The controller controls the voltage supplier to set and supply a bulk voltage depending on a threshold voltage change of the memory cells.

A method of controlling a bulk voltage of a non-volatile memory device according to another aspect of the present invention includes performing an erase/program cycle of the non-volatile memory device for a set number of times. Verification is performed on a memory cell of the non-volatile memory device. In the event that the verification does not pass, a set first voltage is applied to the bulk of the non-volatile memory device and then verification is performed again. In the event that the verification passes, a voltage applied to the bulk is set to a first bulk voltage at the time of a program verification or a read operation of the non-volatile memory device.

A method of controlling a bulk voltage of a non-volatile memory device according to still another aspect of the present invention includes performing an erase/program cycle of the non-volatile memory device. Verification is performed on a memory cell of the non-volatile memory device. In the event that the verification does not pass, a set first voltage is applied to the bulk of the non-volatile memory device and then verification is performed again. In the event that the verification passes, a voltage applied to the bulk is set to a first bulk voltage at the time of a program verification or a read operation of the non-volatile memory device.

DESCRIPTION OF SPECIFIC EMBODIMENTS

Specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the present invention. The present invention is defined by the scope of the claims.

Figure 1A:
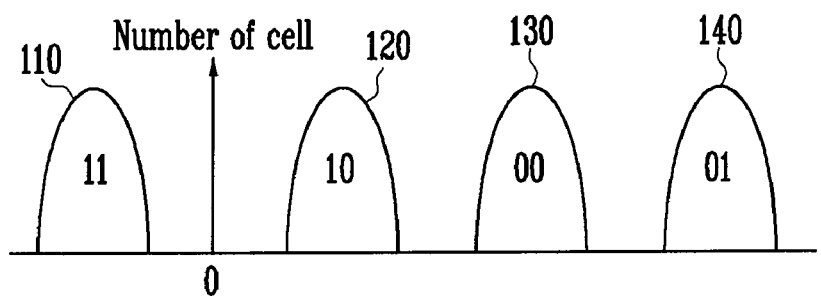
FIG. 1A illustrates program threshold voltage distributions of a MLC.
Figure 1B:
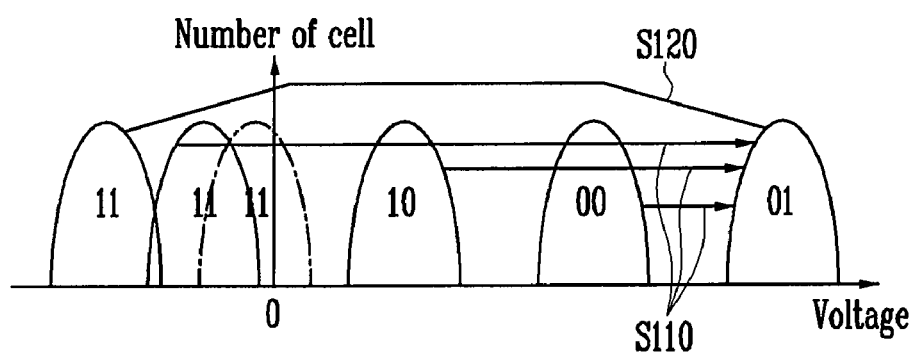
FIG. 1B illustrates the shift of threshold voltage distributions due to an erase of a MLC.
Figure 2A:
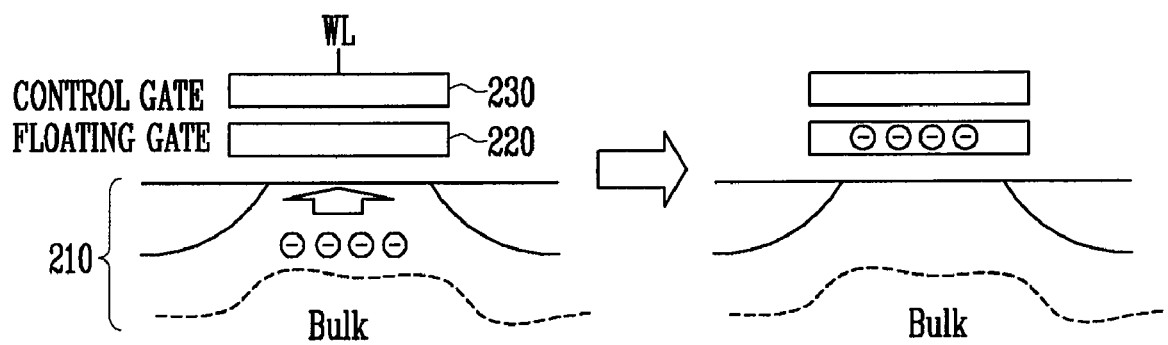
FIG. 2A is a sectional view showing the migration features of electrons depending on a program operation of a memory cell.

FIG. 2A is a sectional view showing the migration features of electrons depending on a program operation of a memory cell.

Referring to FIG. 2A, a memory cell of a flash memory device includes a substrate 210, a floating gate 220, and a control gate 230. A word line WL is connected to the control gate 230. FIG. 2A is a simplified view showing the structure of the memory cell.

In order to store data in the memory cell, a bulk is applied with 0V and the word line WL is applied with a high voltage such that electrons migrate to the floating gate 220. A state where electrons exist in the floating gate 220 is called a program state, and the threshold voltage level of the memory cell becomes high.

The memory cell programmed as described above is erased as follows.

Figure 2B:
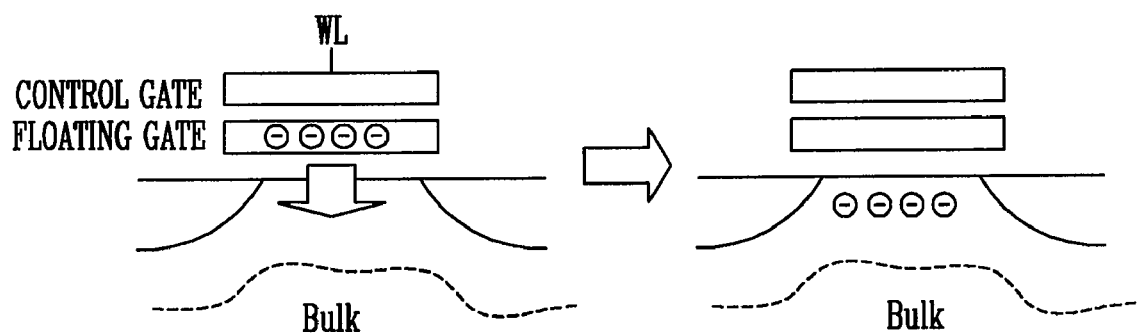
FIG. 2B is a sectional view showing the migration features of electrons depending on an erase operation of a memory cell.

FIG. 2B is a sectional view showing the migration features of electrons depending on an erase operation of a memory cell.

Referring to FIG. 2B, in a state where the electrons migrate to the floating gate 220 of the memory cell and the memory cell is thus programmed, 0V is applied to the word line and a high voltage is applied to the bulk to erase the memory cell. Thus, the electrons migrate from the floating gate 220 to the substrate 210.

If these program and erase operations are repeated as described above, some of the electrons that migrated to the floating gate 220 are confined within the floating gate 220 without migrating to the substrate at the time of the erase operation.

Figure 2C:
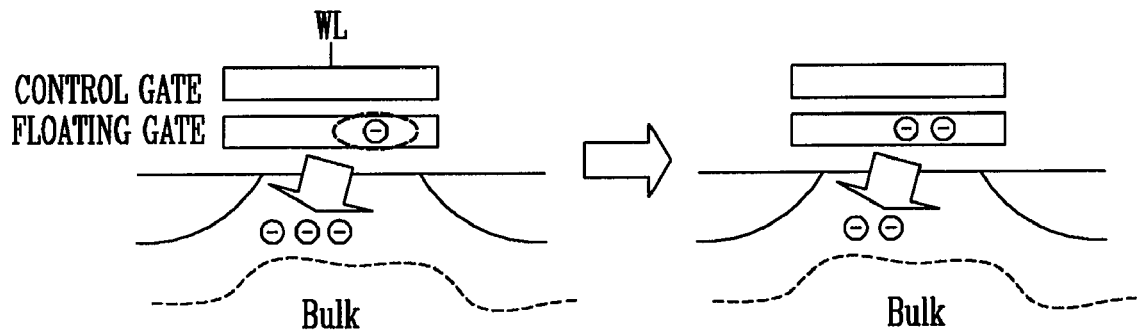
FIG. 2C is a sectional view showing the migration features of electrons depending on the erase/program cycle of a memory cell.

FIG. 2C is a sectional view showing the migration features of electrons depending on the erase/program cycle of a memory cell.

Referring to FIG. 2C, as the number of erase/program cycles is increased to hundreds of thousands of times, the number of electrons confined within the floating gate 220 is increased. If the number of electrons confined within the floating gate 220 is increased, the program or erase state of the memory cell may not be read accurately. To prevent this problem, according to an embodiment of the present invention, the electrons confined within the floating gate 220 can be compensated for by controlling a bulk voltage. This is described below.

Figure 3A:
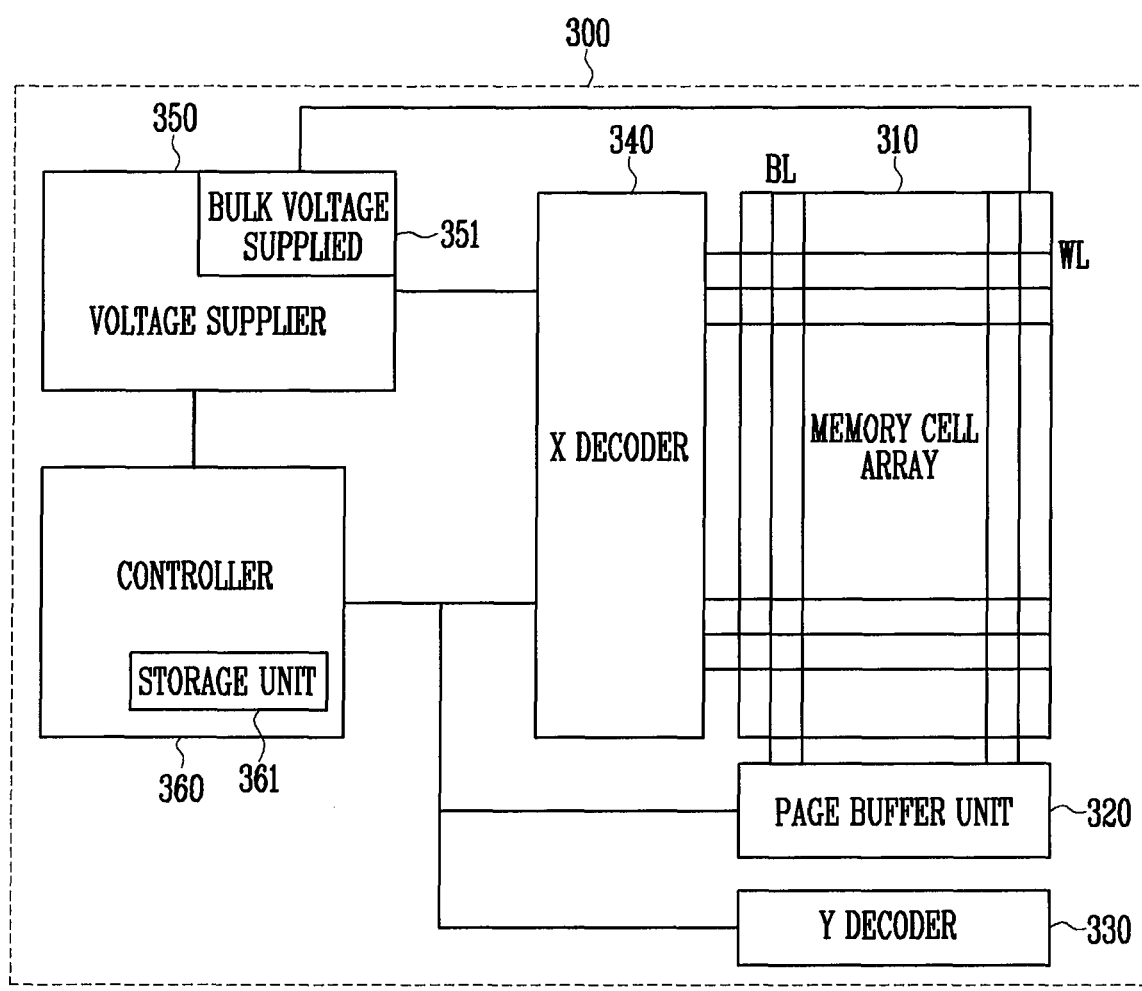
FIG. 3A is a block diagram of a flash memory device in accordance with an embodiment of the present invention.

FIG. 3A is a block diagram of a flash memory device in accordance with an embodiment of the present invention.

Referring to FIG. 3A, a flash memory device 300 in accordance with an embodiment of the present invention includes a memory cell array 310, a page buffer unit 320, a Y decoder 330, an X decoder 340, a voltage supplier 350 and a controller 360. The memory cell array includes memory cells for storing data. Each memory cell includes a word line WL and a bit line BL. The page buffer unit 320 includes a plurality of page buffers for performing data program, verification and read operations on the memory cells of the memory cell array 310. The Y decoder 330 selects the plurality of page buffers according to an input address. The X decoder 340 selects the word lines of the memory cell array 310 according to an input address. The voltage supplier 350 generates voltages for programming data into the memory cells, reads data from the memory cells or erases data of the memory cells. The controller 360 controls operation of the flash memory device 300.

The memory cell array 310 includes the word lines WL and the memory cells connected by the bit lines BL. Data is stored in the memory cells. The page buffer unit 320 is connected to a pair of bit lines of the memory cell array 310 and includes one or more page buffer circuits for performing programming, verification, and reading of data.

The Y decoder 330 and the X decoder 340 select a memory cell for programming or reading under the control of the controller 360. An operation voltage is supplied to the word line through a path provided by the X decoder 340.

The voltage supplier 350 supplies voltages for programming, reading or erasing data with respect to the memory cells. The voltage supplier 350 includes a bulk voltage supplier 351. The bulk voltage supplier 351 supplies a voltage to a bulk of the memory cell array 310 to compensate for increased electrons, which are confined in memory cells as the erase/program cycle is repeated.

The voltage supplier 350 supplies a program voltage which is increased according to the Incremental Step Pulse Programming (ISPP) method. The bulk voltage supplier 351 supplies a bulk voltage while increasing the bulk voltage to a set voltage level according to the ISPP method, under the control of the controller 360.

The controller 360 generates a control signal to control the voltage supplier 350 or an operation of the flash memory device 300 such that a voltage for a program, verification or read operation of the flash memory device 300 is supplied. If a predetermined number or more of the erase/program cycles are performed, the controller 360 controls the bulk voltage supplier 351 to supply a changed bulk voltage. The controller 360 includes a storage unit 361 for storing bulk voltage information for supplying a bulk voltage and for storing other information.

Figure 3B:
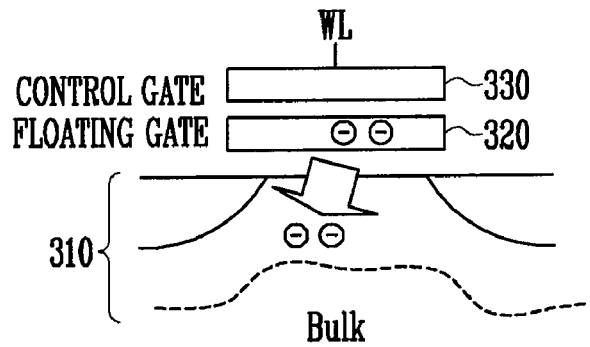
FIG. 3B is a sectional view showing the migration features of electrons of a memory cell when a bulk voltage is not applied in accordance with an embodiment of the present invention.

FIG. 3B is a sectional view showing the migration features of electrons of a memory cell when a bulk voltage is not applied in accordance with an embodiment of the present invention.

Referring to FIG. 3B, the memory cell in accordance with an embodiment of the present invention includes a substrate 310 including a bulk, a floating gate 320, and a control gate 330. The word line WL is connected to the control gate 330.

If the erase/program cycle continues, electrons exist in the floating gate 320 even after an erase is performed. If electrons are confined within the floating gate 320, the threshold voltage of an erased cell may be high. To prevent this problem, a voltage is applied to the bulk according to an embodiment of the present invention.

Figure 3C:
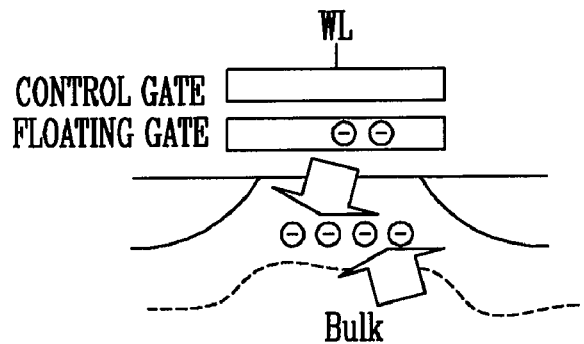
FIG. 3C is a sectional view showing the migration features of electrons depending on when the bulk voltage of FIG. 3B is applied.

FIG. 3C is a sectional view showing the migration features of electrons depending on when the bulk voltage of FIG. 3B is applied.

Referring to FIG. 3C, if a positive voltage is applied to the bulk, the threshold voltage of the memory cell is lowered. Thus, if a program verification or an erase operation is performed in a state where a voltage is applied to the bulk, the threshold voltage of the memory cell can be recognized as a normal threshold voltage level by the positive voltage applied to the bulk even though the threshold voltage of the memory cell has increased. Thus, an error in reading data of the memory cell can be prevented.

The bulk voltage applied to the bulk is controlled by the controller 360. If a predetermined number of program and erase cycles is performed, the bulk voltage is increased to a set level.

If the voltage applied to the bulk is increased, the threshold voltage of the memory cell is lowered, and if the voltage applied to the bulk is lowered, the threshold voltage of the memory cell is increased. Accordingly, the threshold voltage of a memory cell can be increased by applying a negative voltage to the memory cell.

Figure 4:
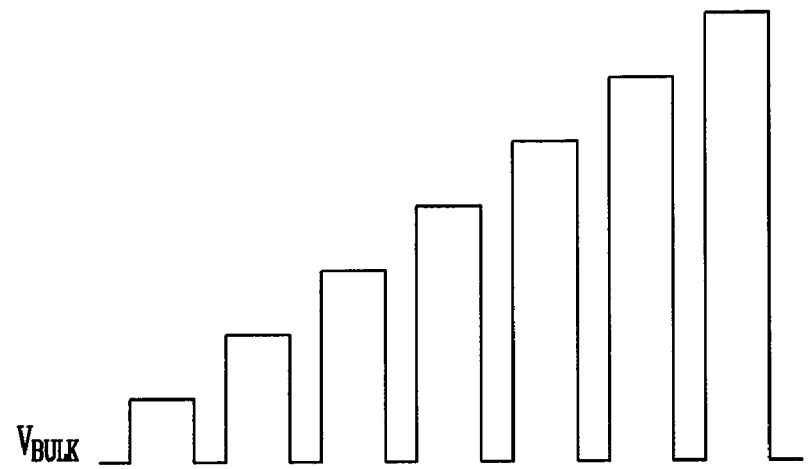
FIG. 4 illustrates bulk voltage levels in a method of controlling the bulk voltage in accordance with an embodiment of the present invention.

FIG. 4 illustrates bulk voltage levels in a method of controlling a bulk voltage in accordance with an embodiment of the present invention.

Referring to FIG. 4, the bulk voltage is increased according to the ISPP method. The controller 360 controls the bulk voltage of the memory cell array 310 to increase according to the number of erase/program cycles. In order to control the bulk voltage as described above, the following operation is performed.

Figure 5:
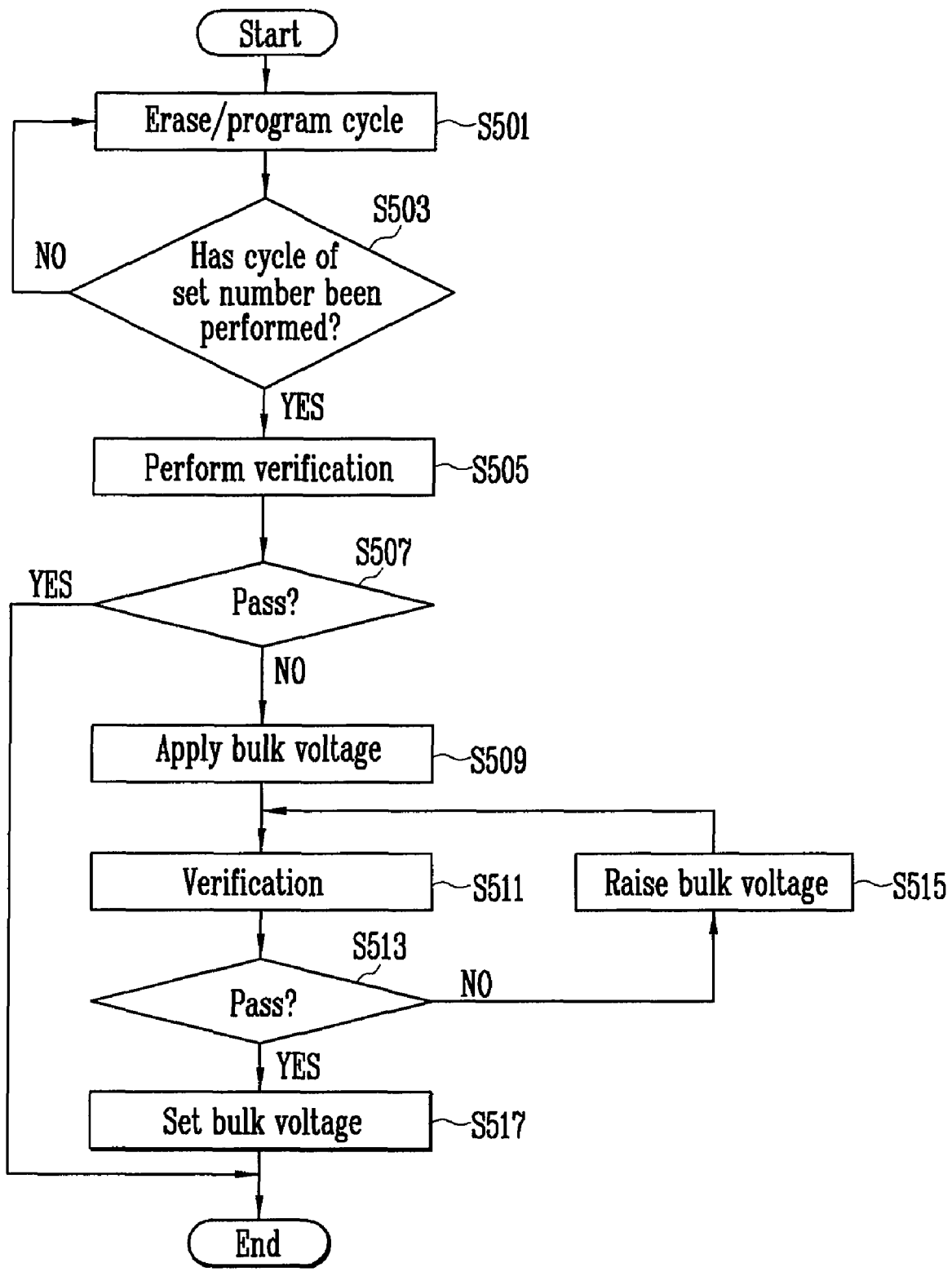
FIG. 5 is a flowchart illustrating a method of setting the bulk voltage according to a first embodiment of the present invention.

FIG. 5 is a flowchart illustrating a method of setting a bulk voltage according to a first embodiment of the present invention.

Referring to FIG. 5, in the method of setting a bulk voltage of a flash memory device, it is determined that whenever the flash memory device performs a program and an erase operation, the erase/program cycle is performed once at step S501. After one erase/program cycle is performed, it is determined whether a current cycle number is identical to a previously set number at step S503. The set number can be the number of the erase/program cycles of which an error can occur in the threshold voltage of the memory cell.

If, as a result of the determination at step S503, the number of the erase/program cycle is identical to the set number, a verification is performed on the memory cell at step S505. If it is determined that all memory cells have passed at step S507, a bulk voltage is not set and the operation of setting a bulk voltage is finished. Thereafter, the cycle number is counted starting from '0' and the operation of setting a bulk voltage can be performed repeatedly depending on whether a set number of erase/program cycles has been performed.

The verification of step S505 determines whether there are failed cells by performing a program operation on the memory cells after the erase/program cycle. In general, if a failed cell exists even though programming is performed by applying the highest voltage set to perform the programming according to the ISPP method, it is determined that the threshold voltage has shifted.

If it is determined that all memory cells have not passed at step S507, it is determined that the threshold voltage of the memory cells has changed. Thus, a bulk voltage is applied to the memory cells at step S509. The applied bulk voltage is applied as an initial bulk voltage previously set by the controller 360.

After the bulk voltage is applied, verification is performed again at step S511. It is then determined whether the memory cells have passed at step S513. If verification of the memory cells has not passed even after the bulk voltage is applied, the controller 360 controls a bulk voltage to be increased to a set voltage level according to the ISPP method at step S515. Verification is then performed again at step S511.

Steps S511 to S515 are repeated until the verification result passes. When the verification result passes, a corresponding bulk voltage is set to a voltage applied to the bulk at the time of a subsequent program verification or read operation of the flash memory device 300 at step S517.

The operation of setting the bulk voltage in the steps S501 to S517 is performed until the erase/program cycle is identical to a set number. After the bulk voltage is set, the cycle number is reset to '0' and the operation of setting the bulk voltage is performed again. The bulk voltage of the step S509 is initially applied as an initial voltage, but when the erase/program operation is repeatedly performed, the bulk voltage can be applied starting from a previous bulk voltage level.

The following method of changing a bulk voltage can be used whenever one erase/program cycle is performed as an alternative to the method of performing the erase/program cycle by setting a bulk voltage when a set number of the cycle is performed.

Figure 6:
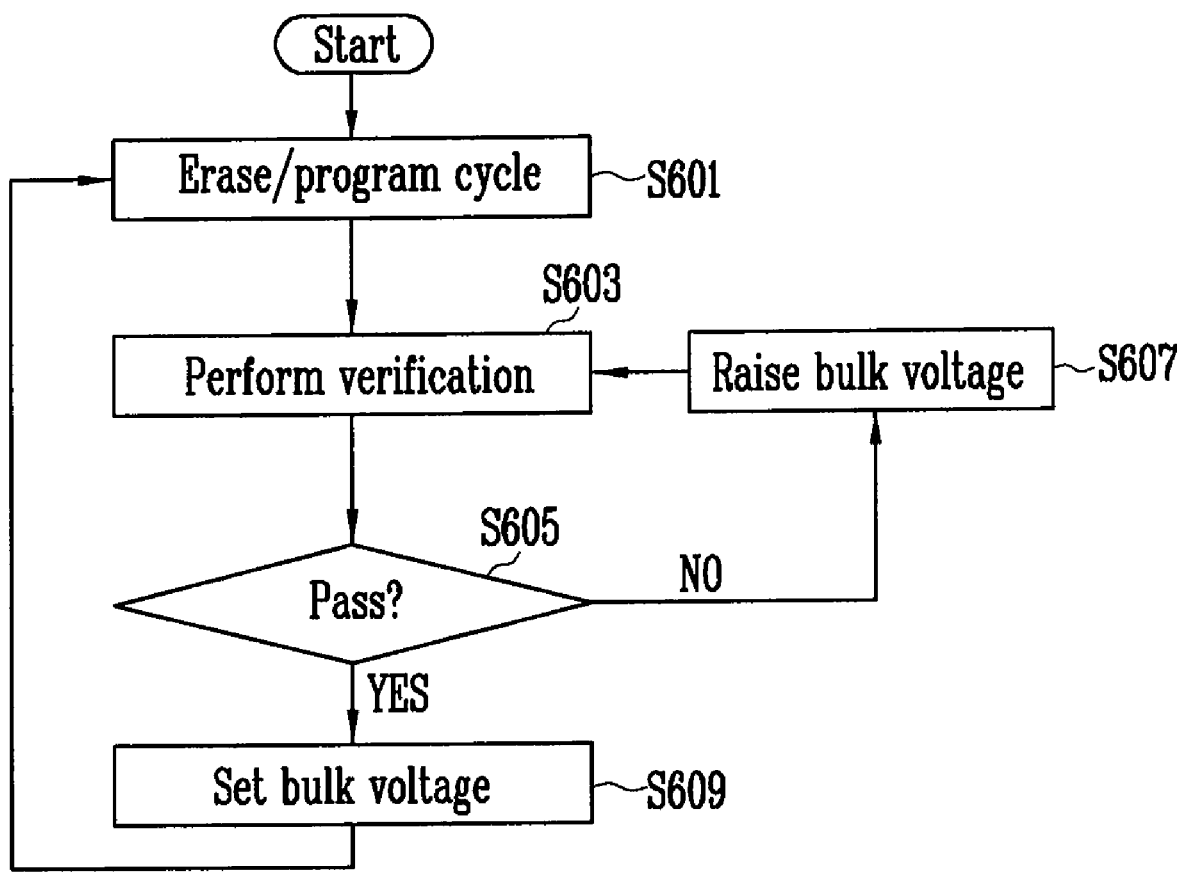
FIG. 6 is a flowchart illustrating a method of setting the bulk voltage according to a second embodiment of the present invention.

FIG. 6 is a flowchart illustrating a method of setting a bulk voltage according to a second embodiment of the present invention.

Referring to FIG. 6, in the method of setting a bulk voltage according to a second embodiment of the present invention, the erase/program cycle is performed in a state where an initial bulk voltage is set to 0V at step S601. After the erase/program cycle is performed once, verification is performed at step S603. If it is determined that the verification result passes at step S605, a current bulk voltage is used as is at step S609. The erase/program cycle is then performed at step S601.

The verification at the step S603 determines whether there are failed memory cells by performing a program operation on the memory cells after the erase/program cycle. In other words, in general, if a failed cell exists even though programming is performed by applying the highest voltage set to perform the programming according to the ISPP method, it is determined that the threshold voltage has shifted.

However, if it is determined that the verification result has not passed at step S605, the controller 360 raises the bulk voltage up to a set voltage level at step S607. Verification is then performed again at step S603. Steps S603 to S607 are repeated until the verification result passes. If the verification result passes, a corresponding passed bulk voltage is set to be applied to the bulk at the time of a subsequent program verification or read operation at step S609.

The controller 360 is aware of a current bulk voltage level. If a block erase is performed after data is programmed into a memory cell block, the erase/program cycle is determined as one erase/program cycle. Furthermore, the bulk voltage can be supplied to the bulk as a negative voltage to increase the threshold voltage of a memory cell as described above.

As described above, according to the non-volatile memory device and the method of controlling a bulk voltage in accordance with the present invention, a threshold voltage change, which occurs as the erase/program cycle is repeatedly performed on memory cells of a non-volatile memory device, is compensated for by applying a voltage to a bulk. Accordingly, the characteristics of a cell can be improved.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A non-volatile memory device, comprising:
a voltage supplier configured to supply a positive voltage to a bulk of a memory cell array during a read operation; and
a controller configured to control the positive voltage level depending on a number of erase/program cycles of the memory cell array.

2. The non-volatile memory device of claim 1, wherein the voltage supplier comprises a bulk voltage supplier for supplying the positive voltage to the bulk of the memory cell array according to a control signal of the controller.

3. The non-volatile memory device of claim 1, wherein the controller controls the positive voltage level to the bulk of the memory cell array if verification of the memory cells of the memory cell array is not successful after an erase/program cycle of the memory cell array is performed.

4. The non-volatile memory device of claim 3, wherein the verification of the memory cells determines whether a program verification result of the memory cells is a failure.

5. The non-volatile memory device of claim 3, wherein the controller controls the verification to be performed by increasing the positive voltage to a predetermined voltage level until the verification result of the memory cells of the memory cell array passes.

6. The non-volatile memory device of claim 5, wherein the controller controls the positive voltage level at which the verification result of the memory cells passes when a subsequent program verification or read operation is performed.

7. The non-volatile memory device of claim 6, wherein the controller includes storage means for storing information about the positive voltage depending on a number of erase/program cycles of the memory cell array.

8. A method of controlling a bulk voltage of a non-volatile memory device, the method comprising:
performing an erase/program cycle of the non-volatile memory device;
performing a first verification on a memory cell of the non-volatile memory device;
in the event that the first verification is not passed, applying a set first voltage to the bulk of the non-volatile memory device and then performing a second verification; and
in the event that the first verification is passed, setting a voltage applied to the bulk to a first bulk voltage at the time of a program verification or read operation of the non-volatile memory device.

9. The method of claim 8, further comprising, after the first bulk voltage is set, resetting the bulk voltage in the event that the erase/program cycle of the non-volatile memory device is performed.

10. The method of claim 8, wherein the first verification determines whether a failure occurs as a result of a program verification at the time of a program operation.

11. The method of claim 9, wherein the resetting of the bulk voltage includes:
applying a second voltage to a bulk and then determining whether a third verification passes, wherein the second voltage is higher than the first bulk voltage by a set voltage level; and
in the event that the third verification passes, setting a voltage applied to the bulk to a second bulk voltage.

12. The method of claim 11, further comprising, in the event that the third verification does not pass, applying a voltage and then determining whether the third verification passes, wherein the applied voltage is higher than the voltage applied to the bulk by a set voltage level.

13. A non-volatile memory device, comprising:
a voltage supplier configured to supply a positive voltage to a bulk of a memory cell array during a read operation; and
a controller configured to control the positive voltage level depending on a threshold voltage distribution of the memory cell array.

14. The non-volatile memory device of claim 13, wherein the voltage supplier comprises a bulk voltage supplier for supplying the positive voltage to the bulk of the memory cell array according to a control signal of the controller.

15. The non-volatile memory device of claim 13, wherein the controller includes storage means for storing information about the positive voltage depending on the threshold voltage distribution of the memory cell array.

16. The non-volatile memory device of claim 13, wherein the threshold voltage distribution is changed by erase/program cycles.

17. The method of claim 8, wherein the performing an erase/program cycle includes performing the erase/program cycle of the non-volatile memory device a predetermined number of times.

* * * * *